(12) United States Patent
Dosluoglu

(10) Patent No.: US 7,247,898 B2
(45) Date of Patent: Jul. 24, 2007

(54) SELF ADJUSTING TRANSFER GATE APS

(75) Inventor: Taner Dosluoglu, New York, NY (US)

(73) Assignee: Dialog Imaging Systems GmbH, Kirchheim/Teck-Nabern (DE)

( * ) Notice: Subject to any disclaimer, the term of this patent is extended or adjusted under 35 U.S.C. 154(b) by 198 days.

(21) Appl. No.: 11/028,772

(22) Filed: Jan. 4, 2005

(65) Prior Publication Data

US 2005/0275036 A1    Dec. 15, 2005

Related U.S. Application Data

(60) Provisional application No. 60/579,929, filed on Jun. 15, 2004.

(51) Int. Cl.
*H01L 29/76* (2006.01)

(52) U.S. Cl. ............. 257/292; 257/371; 257/461; 257/462

(58) Field of Classification Search ............... 257/371, 257/292, 461, 462
See application file for complete search history.

(56) References Cited

U.S. PATENT DOCUMENTS

| | | | |
|---|---|---|---|
| 5,274,459 A * | 12/1993 | Hamasaki | .............. 348/249 |
| 5,363,000 A | 11/1994 | Miyatake et al. | |
| 5,900,623 A | 5/1999 | Tsang et al. | .............. 250/208.1 |
| 6,025,935 A | 2/2000 | Tseng | .............. 358/483 |
| 6,160,282 A | 12/2000 | Merrill | |
| 6,194,770 B1 | 2/2001 | Zarnowski et al. | |
| 6,501,109 B1 | 12/2002 | Chi | .............. 257/223 |
| 6,566,697 B1 | 5/2003 | Fox et al. | .............. 257/292 |
| 2002/0020863 A1 | 2/2002 | Lee et al. | |
| 2003/0107066 A1 | 6/2003 | Stevenson et al. | |
| 2004/0051164 A1 | 3/2004 | Fossum | |

FOREIGN PATENT DOCUMENTS

| | | |
|---|---|---|
| EP | 1 231 641 A1 | 8/2002 |
| JP | 2004015291 | 1/2004 |

* cited by examiner

*Primary Examiner*—Edward Wojciechowicz
(74) *Attorney, Agent, or Firm*—Saile Ackerman LLC; Stephen B. Ackerman; Larry J. Prescott

(57) ABSTRACT

An active pixel sensor circuit comprising a photodiode, a storage node, and a transfer gate between the photodiode and storage node, where the potential barrier between the photodiode and the storage region is maintained during charge accumulation, thereby preventing charge tunneling between the photodiode and the storage region. This is achieved by electrically connecting the transfer gate, which controls charge transfer between the photodiode and the storage region, to the storage region. Connecting the transfer gate to the storage region maintains the potential barrier between the photodiode and the storage region at a threshold voltage during the charge integration period which prevents charge tunneling between the photodiode and the storage node. The threshold voltage is determined by the implant levels used to form the active pixel sensor and can be optimized by using optimum implant levels. This prevention of charge tunneling between the photodiode and the storage node eliminates image lag.

16 Claims, 3 Drawing Sheets

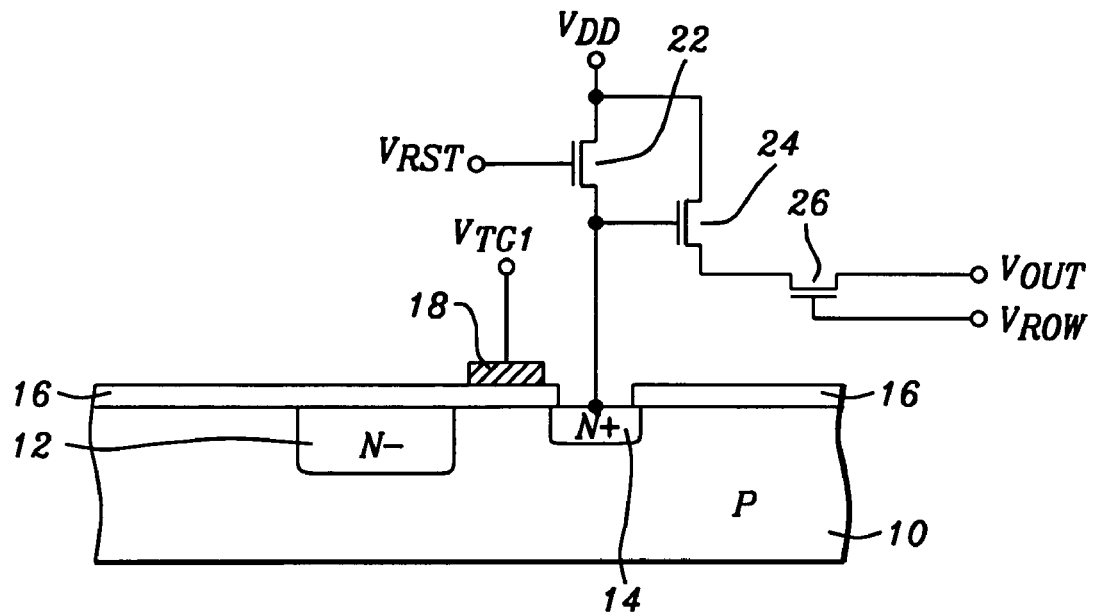
*FIG. 1 - Prior Art*
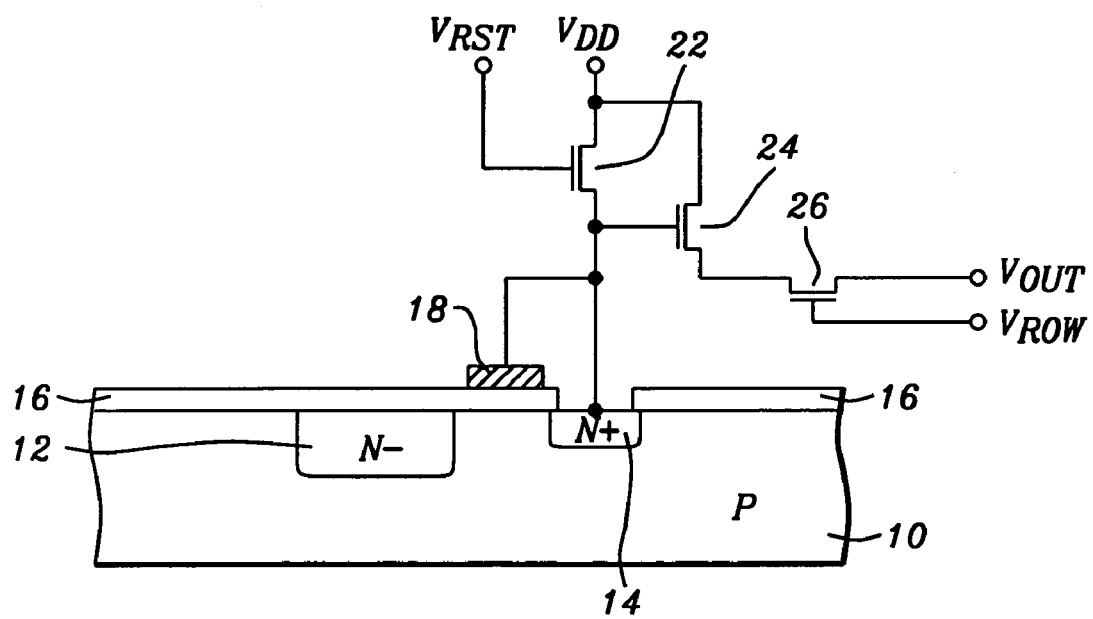
*FIG. 2*

SELF ADJUSTING TRANSFER GATE APS

This Patent Application claims priority to the following U.S. Provisional Patent Application, herein incorporated by reference: 60/579,929, filed Jun. 15, 2004.

BACKGROUND OF THE INVENTION

(1) Field of the Invention

This invention relates to an active pixel sensor, APS, having a transfer gate biased such that the potential barrier between the photodiode and the storage region is not affected by the charge accumulated by the photodiode.

(2) Description of the Related Art

U.S. Pat. No. 6,025,935 to Tseng describes a mechanism to pre-charge or inject a background charge into a storage node and allow the charge to reset through the same output base-to-emitter junction. This removes the residual image and improves the photo-response linearity.

U.S. Pat. No. 5,900,623 to Tsang et al. describes an active pixel sensor using a plurality of photocells, each including a photodiode to sense illumination and a separate storage node with a stored charge that is discharged during an integration period by the photocurrent generated by the photodiode.

U.S. Pat. No. 6,566,697 B1 to Fox et al. describes a transistor coupled between a pinned photodiode and a storage node.

U.S. Pat. No. 6,501,109 B1 to Chi describes a pixel having a photodiode for light collection and a floating gated output diode for output of gate-induced-drain-leakage current to a sense amplifier. The structure is used to reduce blooming and improve image-lag performance.

SUMMARY OF THE INVENTION

One type of active pixel sensor, APS, is shown in FIG. 1. In this configuration a first N well 12 of N⁻ type silicon is formed in a P type silicon epitaxial substrate 10. The junction between the first N well 12 and the substrate 10 forms a photodiode for accumulating charge due to a light signal incident on the first N well 12. A second N well 14 of N⁺ type silicon serves as a storage region. The charge accumulated by the photodiode is transferred to the storage region 14 under the control of the transfer gate 18. The transfer gate is formed on a layer of oxide or other dielectric 16 and is located between the first N well 12 and the second N well 14. The transfer gate is typically set to a global potential $V_{TG1}$. A reset and detection circuit comprising a first N channel field effect transistor, NFET, 22, a second NFET 24, and a third NFET 26 is used to reset the photodiode at the beginning of the charge accumulation period and to readout the charge that has been transferred to the storage region 14. The source of the first NFET 22 and the source of the second NFET 24 are electrically connected to the supply voltage, $V_{DD}$. The drain of the first NFET 22 and the gate of the second NFET 24 are electrically connected to the storage region 14.

One of the problems encountered with the above described APS is that as the photodiode accumulates charge the potential barrier between the photodiode and the storage region decreases and charge tunneling from the photodiode to the storage region will occur. This causes undesirable image lag.

It is a principal objective of this invention to provide an active pixel sensor circuit where the potential barrier between the photodiode and the storage region is maintained during charge accumulation and charge tunneling between the photodiode and storage region is prevented.

This objective is achieved by electrically connecting the transfer gate 18 to the storage region 14. This maintains the potential barrier between the storage region 14 and the photodiode at $V_t$, where $V_t$ is a threshold voltage, during the charge integration period and charge tunneling between the photodiode and the storage node 14 is prevented. This threshold voltage, $V_t$, is determined by the implant levels used to form the active pixel sensor. Optimum implant levels can be chosen to achieve an optimum threshold voltage. This prevention of charge tunneling between the photodiode and the storage node 14 eliminates image lag.

BRIEF DESCRIPTION OF THE DRAWINGS

FIG. 1 shows a schematic diagram of a typical APS circuit with the transfer gate connected to a global potential.

FIG. 2 shows a schematic diagram of the APS circuit of this invention using N type wells formed in a P type substrate and a single transfer gate.

DESCRIPTION OF THE PREFERRED EMBODIMENTS

Figure 3:
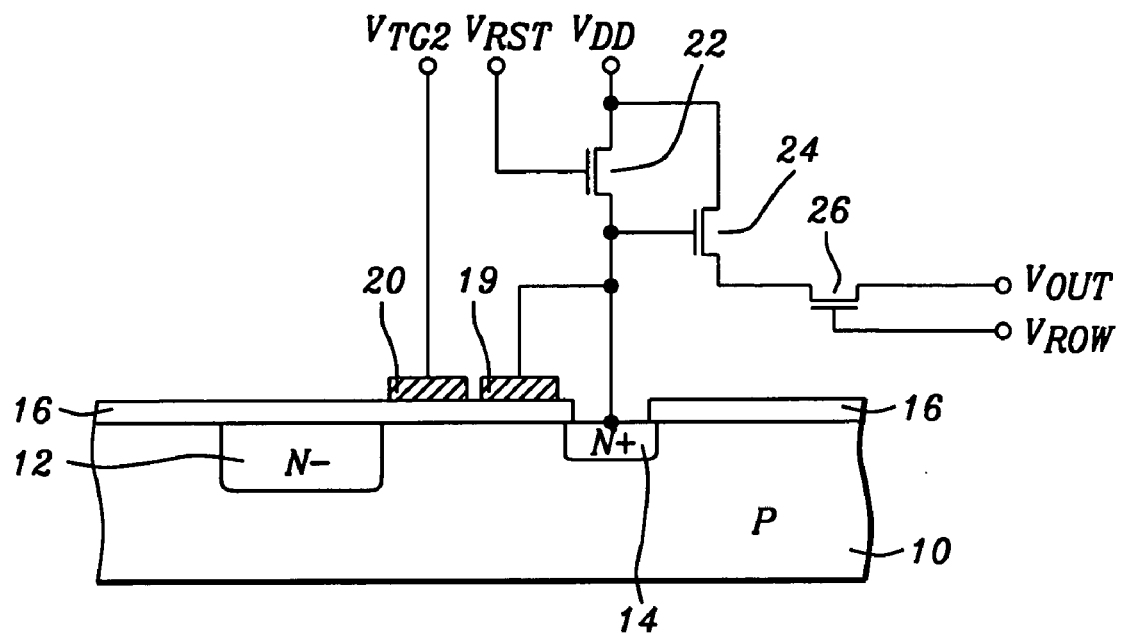
FIG. 3 shows a schematic diagram of the APS circuit of this invention using N type wells formed in a P type substrate, a first transfer gate connected to the storage region, and a second transfer gate to provide snapshot capability.

FIG. 2 shows a schematic diagram of a first preferred embodiment of the active pixel sensor, APS, of this invention. As shown in FIG. 2 a first N well 12 of N⁻ type silicon is formed in a P type silicon epitaxial substrate 10. The junction between the first N well 12 and the substrate 10 forms a photodiode for accumulating charge due to a light signal incident on the first N well 12. A second N well 14 of N⁺ type silicon is also formed in the P type epitaxial substrate 10 and serves as a storage region. The charge accumulated by the photodiode is transferred to the storage region 14 under the control of a transfer gate 18. The transfer gate 18 is formed of a conducting material, such as polysilicon, on a layer of dielectric 16, such as silicon dioxide, and is located between the first N well 12 and the second N well 14. The transfer gate 18 and the second N well 14 are electrically connected together so that the potential between the second N well and the photodiode is held at a threshold voltage $V_t$, where the threshold voltage is determined by the implant levels used to form the active pixel sensor. Typically optimum implant levels are used to produce an optimum threshold voltage.

A reset and detection circuit comprising a first N channel field effect transistor, NFET, 22, a second NFET 24, and a third NFET 26 is used to reset the photodiode at the beginning of the charge accumulation period and to readout the charge that has been transferred to the storage region 14. The source of the first NFET 22 and the source of the second NFET 24 are electrically connected to the supply voltage, $V_{DD}$, which is the highest potential in the circuit. The drain of the first NFET 22 and the gate of the second NFET 24 are electrically connected to the transfer gate and the storage region 14. The gate of the first NFET 22 is connected to a reset signal voltage, $V_{RST}$, which turns the first NFET 22 on during reset. The drain of the third NFET 26 is connected to an output signal terminal, $V_{OUT}$. The gate of the third NFET 26 is connected to a row signal voltage, $V_{ROW}$, which turns the third NFET 26 on during readout.

A key element of this invention, as shown in FIG. 2, is that the transfer gate 18 is electrically connected to the storage region 14, rather than to a global voltage supply. As charge is accumulated by the first N well 12 during the charge accumulation period the potential of the storage region 14 will be affected, however the potential under the transfer gate tracks the potential of the storage region 14. This maintains the potential barrier between the first N well 12 and the storage region 14 at the threshold voltage, $V_t$, during the charge integration period thereby preventing charge tunneling between the first N well and the storage region 14 until the charge is to be readout. An additional advantage is noise immunity since the transfer gate is not connected to a global voltage supply and is therefore not affected by power supply noise. During the reset period the amount of charge required to reset the pixel is the amount of charge accumulated by the first N well 12 during the charge integration period.

A second preferred embodiment of this invention is shown in FIG. 3. As shown in FIG. 3 a first N well 12 of N type silicon is formed in a P type silicon epitaxial substrate 10. The junction between the first N well 12 and the substrate 10 forms a photodiode for accumulating charge due to a light signal incident on the first N well 12. A second N well 14 of N$^+$ type silicon is also formed in the P type epitaxial substrate 10 and serves as a storage region. The charge accumulated by the photodiode is transferred to the storage region 14 under the control of a first transfer gate 19. The first transfer gate 19 is formed of a conducting material, such as polysilicon, on a layer of dielectric 16, such as silicon dioxide, and is located between the first N well 12 and the second N well 14. As shown in FIG. 3, in this embodiment a second transfer gate 20, formed of a conducting material such as polysilicon, is also formed on the layer of dielectric 16 in the region between the first N well 12 and the storage region 14. A key part of this invention is that the first transfer gate 19 is electrically connected to the storage region 14. Since the first transfer gate 19 and the second N well 14 are electrically connected together, the potential between the second N well 14 and the photodiode is held at a threshold voltage $V_t$, where the threshold voltage is determined by the implant levels used to form the active pixel sensor. Typically optimum implant levels are used to produce an optimum threshold voltage. The second transfer gate 20 is connected to a global voltage supply, $V_{TG2}$, and provides a shutter which gives snapshot capability. The second transfer gate 20 is used only as a complete barrier to charge transfer or is completely on and is not part of the charge transfer mechanism, so the second transfer gate does not detract from the advantages of connecting the first transfer gate 16 to the storage region 14.

A reset and detection circuit comprising a first N channel field effect transistor, NFET, 22, a second NFET 24, and a third NFET 26 is used to reset the photodiode at the beginning of the charge accumulation period and to readout the charge that has been transferred to the storage region 14. The source of the first NFET 22 and the source of the second NFET 24 are electrically connected to the supply voltage, $V_{DD}$, which is the highest potential in the circuit. The drain of the first NFET 22 and the gate of the second NFET 24 are electrically connected to the transfer gate and the storage region 14. The gate of the first NFET 22 is connected to a reset signal voltage, $V_{RST}$, which turns the first NFET 22 on during reset. The drain of the third NFET 26 is connected to an output signal terminal, $V_{OUT}$. The gate of the third NFET 26 is connected to a row signal voltage, $V_{ROW}$, which turns the third NFET 26 on during readout.

A key element of this second embodiment, as shown in FIG. 3, is that the first transfer gate 19 is electrically connected to the storage region 14, rather than to a global voltage supply. As charge is accumulated by the first N well 12 during the charge accumulation period the potential of the storage region 14 will be affected, however the potential under the first transfer 19 gate tracks the potential of the storage region 14. This maintains the potential barrier between the first N well 12 and the storage region 14 at the threshold voltage, $V_t$, during the charge integration period thereby preventing charge tunneling between the first N well 12 and the storage region 14 until the charge is to be readout. An additional advantage is noise immunity since the transfer gate is not connected to a global voltage supply and is therefore not affected by power supply noise. During the reset period the amount of charge required to reset the pixel is the amount of charge accumulated by the first N well 12 during the charge integration period.

In the following two embodiments the P type silicon substrate is replaced by an N type silicon substrate, N$^-$ type silicon regions are replaced by P$^-$ type silicon regions, N$^+$ type silicon regions are replaced by P$^+$ type silicon regions, N channel field effect transistors are replaced by P channel field effect transistors, and the highest potential in the circuit is replaced by the lowest potential in the circuit.

Figure 4:
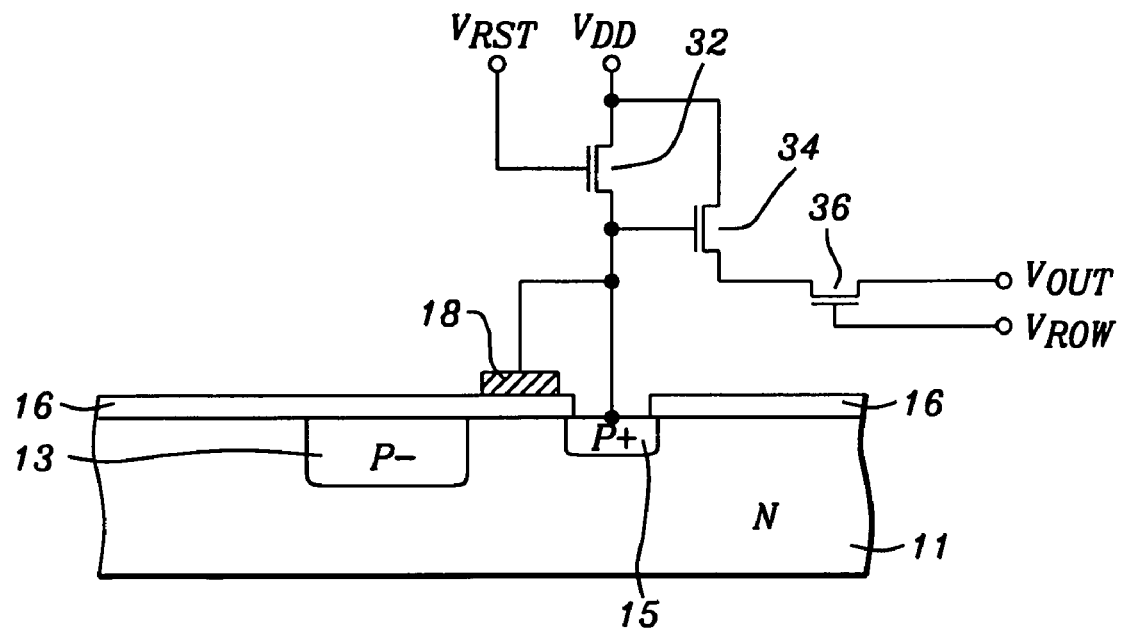
FIG. 4 shows a schematic diagram of the APS circuit of this invention using P type wells formed in an N type substrate and a single transfer gate.

A third preferred embodiment of the active pixel sensor, APS, of this invention is shown in FIG. 4. As shown in FIG. 4 a first P well 13 of P$^-$ type silicon is formed in an N type silicon epitaxial substrate 11. The junction between the first P well 13 and the substrate 11 forms a photodiode for accumulating charge due to a light signal incident on the first P well 13. A second P well 15 of P$^+$ type silicon is also formed in the N type epitaxial substrate 11 and serves as a storage region. The charge accumulated by the photodiode is transferred to the storage region 15 under the control of a transfer gate 18. The transfer gate 18 is formed of a conducting material, such as polysilicon, on a layer of dielectric 16, such as silicon dioxide, and is located between the first P well 13 and the second P well 15. The transfer gate 18 and the second P well 15 are electrically connected together so that the potential between the second P well 15 and the photodiode is held at a threshold voltage $V_t$, where the threshold voltage is determined by the implant levels used to form the active pixel sensor. Typically optimum implant levels are used to produce an optimum threshold voltage.

A reset and detection circuit comprising a first P channel field effect transistor, PFET, 32, a second PFET 34, and a third PFET 36 is used to reset the photodiode at the beginning of the charge accumulation period and to readout the charge that has been transferred to the storage region 15. The source of the first PFET 32 and the source of the second PFET 34 are electrically connected to the supply voltage, $V_{DD}$, which is the lowest potential in the circuit. The drain of the first PFET 32 and the gate of the second PFET 34 are electrically connected to the transfer gate and the storage region 15. The gate of the first PFET 32 is connected to a reset signal voltage, $V_{RST}$, which turns the first PFET 32 on during reset. The drain of the third PFET 36 is connected to an output signal terminal, $V_{OUT}$. The gate of the third PFET 36 is connected to a row signal voltage, $V_{ROW}$, which turns the third PFET 36 on during readout.

A key element of this third embodiment, as shown in FIG. 4, is that the transfer gate 18 is electrically connected to the storage region 15, rather than to a global voltage supply. As charge is accumulated by the first P well 13 during the charge accumulation period the potential of the storage region 15 will be affected, however the potential under the transfer gate tracks the potential of the storage region 15. This maintains the potential barrier between the first P well 13 and the storage region 15 at the threshold voltage, $V_t$, during the charge integration period thereby preventing charge tunneling between the first P well 13 and the storage region 15 until the charge is to be readout. An additional advantage is noise immunity since the transfer gate is not connected to a global voltage supply and is therefore not affected by power supply noise. During the reset period the amount of charge required to reset the pixel is the amount of charge accumulated by the first P well 13 during the charge integration period.

Figure 5:
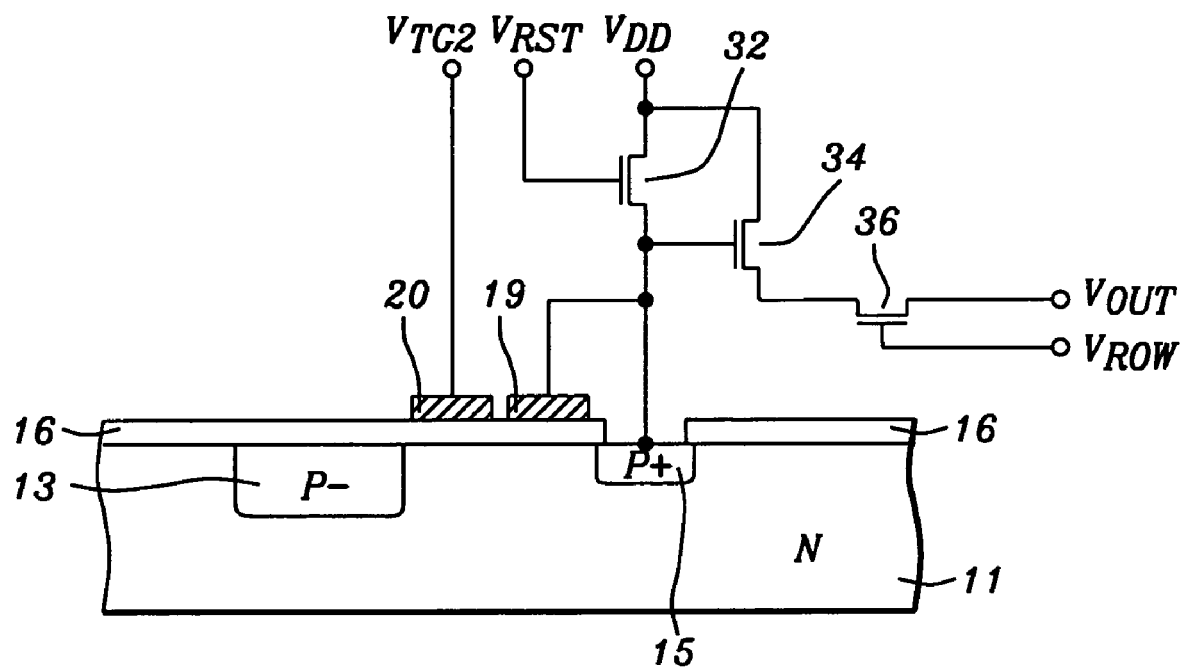
FIG. 5 shows a schematic diagram of the APS circuit of this invention using P type wells formed in an N type substrate, a first transfer gate connected to the storage region, and a second transfer gate to provide snapshot capability.

A fourth preferred embodiment of this invention is shown in FIG. 5. As shown in FIG. 5 a first P well 13 of $P^-$ type silicon is formed in an N type silicon epitaxial substrate 11. The junction between the first P well 13 and the substrate 11 forms a photodiode for accumulating charge due to a light signal incident on the first P well 13. A second P well 15 of $P^+$ type silicon is also formed in the N type epitaxial substrate 11 and serves as a storage region. The charge accumulated by the photodiode is transferred to the storage region 15 under the control of a first transfer gate 19. The first transfer gate 19 is formed of a conducting material, such as polysilicon, on a layer of dielectric 16, such as silicon dioxide, and is located between the first P well 13 and the second P well 15. As shown in FIG. 5, in this embodiment a second transfer gate 20 is formed of a conducting material, such as polysilicon, on the dielectric layer 16 over the region between the first P well 13 and the storage region 15. As in the third embodiment, the first transfer gate 19 is electrically connected to the storage region 15. Since the first transfer gate 19 is electrically connected to the storage region 15 the potential between the storage region 15 and the photodiode is held at the threshold voltage, $V_t$, where the threshold voltage is determined by the implant levels used to form the active pixel sensor. Typically optimum implant levels are used to produce an optimum threshold voltage. The second transfer gate 20 is connected to a global voltage supply, $V_{TG2}$, and provides a shutter which gives snapshot capability. The second transfer gate 20 is used only as a complete barrier to charge transfer or is completely on and is not part of the charge transfer mechanism, so the second transfer gate does not detract from the advantages of connecting the first transfer gate 16 to the storage region 15.

A reset and detection circuit comprising a first P channel field effect transistor, PFET, 32, a second PFET 34, and a third PFET 36 is used to reset the photodiode at the beginning of the charge accumulation period and to readout the charge that has been transferred to the storage region 15. The source of the first PFET 32 and the source of the second PFET 34 are electrically connected to the supply voltage, $V_{DD}$, which is the lowest potential in the circuit. The drain of the first PFET 32 and the gate of the second PFET 34 are electrically connected to the transfer gate and the storage region 15. The gate of the first PFET 32 is connected to a reset signal voltage, $V_{RST}$, which turns the first PFET 32 on during reset. The drain of the third PFET 36 is connected to an output signal terminal, $V_{OUT}$. The gate of the third PFET 36 is connected to a row signal voltage, $V_{ROW}$, which turns the third PFET 36 on during readout.

A key element of this fourth embodiment, as shown in FIG. 5, is that the first transfer gate 19 is electrically connected to the storage region 15, rather than to a global voltage supply. As charge is accumulated by the first P well 13 during the charge accumulation period the potential of the storage region 15 will be affected, however the potential under the transfer gate tracks the potential of the storage region 15. This maintains the potential barrier between the first P well 13 and the storage region 15 at the threshold voltage, $V_t$, during the charge integration period thereby preventing charge tunneling between the first P well 13 and the storage region 15 until the charge is to be readout. An additional advantage is noise immunity since the transfer gate is not connected to a global voltage supply and is therefore not affected by power supply noise. During the reset period the amount of charge required to reset the pixel is the amount of charge accumulated by the first P well 13 during the charge integration period.

While the invention has been particularly shown and described with reference to the preferred embodiments thereof, it will be understood by those skilled in the art that various changes in form and details may be made without departing from the spirit and scope of the invention.

What is claimed is:

1. A self adjusting transfer gate, comprising:
 a substrate having a top surface, wherein said substrate is a P type silicon substrate;
 a first N well formed in said substrate wherein said first N well is $N^-$ type silicon and the junction between said substrate and said first N well forms a photodiode;
 a second N well formed in said substrate wherein said second N Well is $N^+$ type silicon and forms a storage node;
 a layer of dielectric material formed on the top surface of said substrate wherein said layer of dielectric material covers at least that part of said top surface of said substrate between said first N well and said second N well;
 a transfer gate electrode formed on said layer of dielectric material wherein said transfer gate electrode is directly over that part of said top surface of said substrate between said first N well and said second N well;
 a detection/reset circuit comprising a first NFET (N channel field effect transistor) having a source, a gate and a drain and a second NFET having a source, a gate and a drain wherein said source of said first NFET and said source of said second NFET are connected to a supply voltage and said gate of said first NFET is connected to a reset signal voltage; and
 an electrical connection formed between said second N well, said transfer gate electrode, said drain of said first NFET, and said gate of said second NFET, thereby maintaining said transfer gate electrode and said second N well at the same electrical potential.

2. The self adjusting transfer gate of claim 1 wherein said detection/reset circuit further comprises a third NFET having a source, a gate, and a drain, wherein said drain of said second NFET is connected to said source of said third NFET, said gate of said third NFET is connected to a row select signal voltage and said drain of said third NFET is connected to an output voltage terminal.

3. The self adjusting transfer gate of claim 2 wherein said supply voltage is the highest electrical potential of the circuit.

4. A self adjusting transfer gate, comprising:
a substrate having a top surface, wherein said substrate is a P type silicon substrate;
a first N well formed in said substrate wherein said first N well is N⁻ type silicon and the junction between said substrate and said first N well forms a photodiode;
a second N well formed in said substrate wherein said second N Well is N⁺ type silicon and forms a storage node;
a layer of dielectric material formed on the top surface of said substrate wherein said layer of dielectric material covers at least that part of said top surface of said substrate between said first N well and said second N well;
a first transfer gate electrode formed on said layer of dielectric material wherein said first transfer gate electrode is directly over that part of said top surface of said substrate between said first N well and said second N well;
a second transfer gate electrode formed on said layer of dielectric material wherein said second transfer gate electrode is directly over that part of said top surface of said substrate between said first N well and said second N well and said first transfer gate electrode is electrically isolated from said second transfer gate electrode;
means to maintain said second transfer gate electrode at a global potential;
a detection/reset circuit comprising a first NFET (N channel field effect transistor) having a source, a gate and a drain and a second NFET having a source, a gate and a drain wherein said source of said first NFET and said source of said second NFET are connected to a supply voltage and said gate of said first NFET is connected to a reset signal voltage; and
an electrical connection formed between said second N well, said first transfer gate electrode, said drain of said first NFET, and said gate of said second NFET, thereby maintaining said transfer gate electrode and said second N well at the same electrical potential.

5. The self adjusting transfer gate of claim 4 wherein said means to maintain said second transfer gate electrode at a global potential comprises a global voltage source and an electrical connection between said global voltage source and said second transfer gate electrode.

6. The self adjusting transfer gate of claim 4 wherein said second transfer gate electrode is between said first transfer gate electrode and said first N well.

7. The self adjusting transfer gate of claim 4 wherein said detection/reset circuit further comprises a third NFET each having a source, a gate, and a drain, wherein said drain of said second NFET is connected to said source of said third NFET, said gate of said third NFET is connected to a row select signal voltage and said drain of said third NFET is connected to an output voltage terminal.

8. The self adjusting transfer gate of claim 7 wherein said supply voltage source is the highest electrical potential of the circuit.

9. A self adjusting transfer gate, comprising:
a substrate having a top surface, wherein said substrate is an N type silicon substrate;
a first P well formed in said substrate wherein said first P well is P⁻ type silicon and the junction between said substrate and said first P well forms a photodiode;
a second P well formed in said substrate wherein said second P Well is P⁺ type silicon and forms a storage node;
a layer of dielectric material formed on the top surface of said substrate wherein said layer of dielectric material covers at least that part of said top surface of said substrate between said first P well and said second P well;
a transfer gate electrode formed on said layer of dielectric material wherein said transfer gate is directly over that part of said top surface of said substrate between said first P well and said second P well;
a detection/reset circuit comprising a first PFET (P channel field effect transistor) having a source, a gate and a drain and a second PFET having a source, a gate and a drain wherein said source of said first PFET and said source of said second PFET are connected to a supply voltage and said gate of said first PFET is connected to a reset signal voltage;
an electrical connection formed between said second P well, said transfer gate electrode, said drain of said first PFET, and said gate of said second PFET, thereby maintaining said transfer gate electrode and said second P well at the same electrical potential.

10. The self adjusting transfer gate of claim 9 wherein said detection/reset circuit further comprises a third PFET having a source, a gate, and a drain, wherein said drain of said second PFET is connected to said source of said third PFET, said gate of said third PFET is connected to a row select signal voltage and said drain of said third PFET is connected to an output voltage terminal.

11. The self adjusting transfer gate of claim 10 wherein said supply voltage is the lowest electrical potential of the circuit.

12. A self adjusting transfer gate, comprising:
a substrate having a top surface, wherein said substrate is an N type silicon substrate;
a first P well formed in said substrate wherein said first P well is P⁻ type silicon and the junction between said substrate and said first P well forms a photodiode;
a second P well formed in said substrate wherein said second P Well is P⁺ type silicon and forms a storage node;
a layer of dielectric material formed on the top surface of said substrate wherein said layer of dielectric material covers at least that part of said top surface of said substrate between said first P well and said second P well;
a first transfer gate electrode formed on said layer of dielectric material wherein said first transfer gate electrode is directly over that part of said top surface of said substrate between said first P well and said second P well;
a second transfer gate electrode formed on said layer of dielectric material wherein said second transfer gate electrode is directly over that part of said top surface of said substrate between said first P well and said second P well and said first transfer gate electrode is electrically isolated from said second transfer gate electrode;
means to maintain said second transfer gate electrode at a global potential;
a detection/reset circuit comprising a first PFET (P channel field effect transistor) having a source, a gate and a drain and a second PFET having a source, a gate and a drain wherein said source of said first PFET and said source of said second PFET are connected to a supply voltage and said gate of said first PFET is connected to a reset signal voltage; and an electrical connection formed between said second P well, said first transfer gate electrode, said drain of said first PFET, and said gate of said second PFET, thereby maintaining said transfer gate electrode and said second P well at the same electrical potential.

13. The self adjusting transfer gate of claim 12 wherein said means to maintain said second transfer gate electrode at a global potential comprises a global voltage source and an electrical connection between said global voltage source and said second transfer gate electrode.

14. The self adjusting transfer gate of claim 12 wherein said second transfer gate electrode is between said first transfer gate electrode and said first P well.

15. The self adjusting transfer gate of claim 12 wherein said detection/reset circuit further comprises a third PFET having a source, a gate, and a drain, wherein drain of said second PFET is connected to said source of said third PFET, said gate of said third PFET is connected to a row select signal voltage and said drain of said third PFET is connected to an output voltage terminal.

16. The self adjusting transfer gate of claim 15 wherein said supply voltage source is the lowest electrical potential of the circuit.

* * * * *